(12) United States Patent
Park et al.

(10) Patent No.: US 10,770,454 B2
(45) Date of Patent: Sep. 8, 2020

(54) ON-CHIP METAL-INSULATOR-METAL (MIM) CAPACITOR AND METHODS AND SYSTEMS FOR FORMING SAME

(71) Applicant: GLOBALFOUNDRIES INC., Grand Cayman (KY)

(72) Inventors: Chanro Park, Clifton Park, NY (US); Ruilong Xie, Niskayuna, NY (US); Kangguo Cheng, Schenecdtady, NY (US); Juntao Li, Cohoes, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/948,609

(22) Filed: Apr. 9, 2018

(65) Prior Publication Data

US 2019/0312028 A1 Oct. 10, 2019

(51) Int. Cl.
| | | |
|---|---|---|
| *H01L 27/108* | (2006.01) | |
| *H01L 27/06* | (2006.01) | |
| *H01L 29/78* | (2006.01) | |
| *H01L 21/8234* | (2006.01) | |
| *H01L 21/762* | (2006.01) | |
| *H01L 49/02* | (2006.01) | |

(52) U.S. Cl.
CPC .... *H01L 27/0629* (2013.01); *H01L 21/76224* (2013.01); *H01L 21/823431* (2013.01); *H01L 28/40* (2013.01); *H01L 29/785* (2013.01)

(58) Field of Classification Search
USPC ........................................................ 257/301
See application file for complete search history.

(56) References Cited

U.S. PATENT DOCUMENTS

| | | |
|---|---|---|
| 8,963,223 B2 | 2/2015 | Xia et al. |
| 9,564,428 B1 * | 2/2017 | Basker ............... H01L 27/0733 |
| 2011/0115005 A1 | 5/2011 | Coolbaugh et al. |
| 2017/0125510 A1 | 5/2017 | Balakrishnan et al. |
| 2018/0254218 A1 * | 9/2018 | Cheng et al. ... H01L 21/823462 |

* cited by examiner

*Primary Examiner* — Caleb E Henry
(74) *Attorney, Agent, or Firm* — Williams Morgan, P.C.

(57) ABSTRACT

We report a semiconductor device, containing a semiconductor substrate; an isolation feature on the substrate; a plurality of gates on the isolation feature, wherein each gate comprises a gate electrode and a high-k dielectric layer disposed between the gate electrode and the isolation feature and disposed on and in contact with at least one side of the gate electrode; and a fill metal between the plurality of gates on the isolation feature. We also report methods of forming such a device, and a system for manufacturing such a device.

8 Claims, 8 Drawing Sheets

ON-CHIP METAL-INSULATOR-METAL (MIM) CAPACITOR AND METHODS AND SYSTEMS FOR FORMING SAME

BACKGROUND OF THE INVENTION

Field of the Invention

Generally, the present disclosure relates to the manufacture of sophisticated semiconductor devices, and more specifically, to semiconductor devices containing an on-chip metal-insulator-metal (MIM) capacitor.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one or more of various techniques, a plurality of fins are formed on an active region of a substrate. The substrate may also include a non-active region lacking any fins. A plurality of gates is then formed in the active region over the fins in an orientation perpendicular to the plurality of fins. To minimize process variation, the gate formation process generally also forms an additional plurality of gates over the non-active region of the substrate. The gates formed over the non-active region are dummy gates that serve no function in prior art devices.

In many state-of-the-art devices, capacitors formed on semiconductor chips generally are formed as MOS capacitors formed during front end of line (FEOL) processing. In other state-of-the-art devices, metal-insulator-metal capacitors are formed during back end of line (BEOL) processing. However, these state-of-the-art capacitors require performing dedicated processing in active regions, which requires usage of processing resources and valuable chip area.

The present disclosure may provide a function to gates formed over non-active regions of a substrate.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods and systems for forming semiconductor devices containing both FinFET devices and MIM capacitors, and the semiconductor devices so formed. The MIM capacitors are formed in part from dummy gates in otherwise non-active regions of a semiconductor substrate.

In one embodiment, the present disclosure relates to a method including forming an isolation feature on a semiconductor substrate; forming a plurality of gates on the isolation feature, wherein each gate comprises a gate electrode and a high-k dielectric layer disposed between the gate electrode and the isolation feature and disposed on and in contact with at least one side of the gate electrode; and depositing a fill metal between the plurality of gates on the isolation feature.

In one embodiment, the present disclosure relates to a system containing a semiconductor device processing system to manufacture a semiconductor device; and a processing controller operatively coupled to the semiconductor device processing system, the processing controller configured to control an operation of the semiconductor device processing system; wherein the semiconductor device processing system is adapted to perform the method referred to above.

In one embodiment, the present disclosure relates to a semiconductor device, containing a semiconductor substrate; an isolation feature on the substrate; a plurality of gates on the isolation feature, wherein each gate comprises a gate electrode and a high-k dielectric layer disposed between the gate electrode and the isolation feature and disposed on and in contact with at least one side of the gate electrode; and a fill metal between the plurality of gates on the isolation feature.

BRIEF DESCRIPTION OF THE DRAWINGS

The disclosure may be understood by reference to the following description taken in conjunction with the accompanying drawings, in which like reference numerals identify like elements, and in which.

Figure 1:
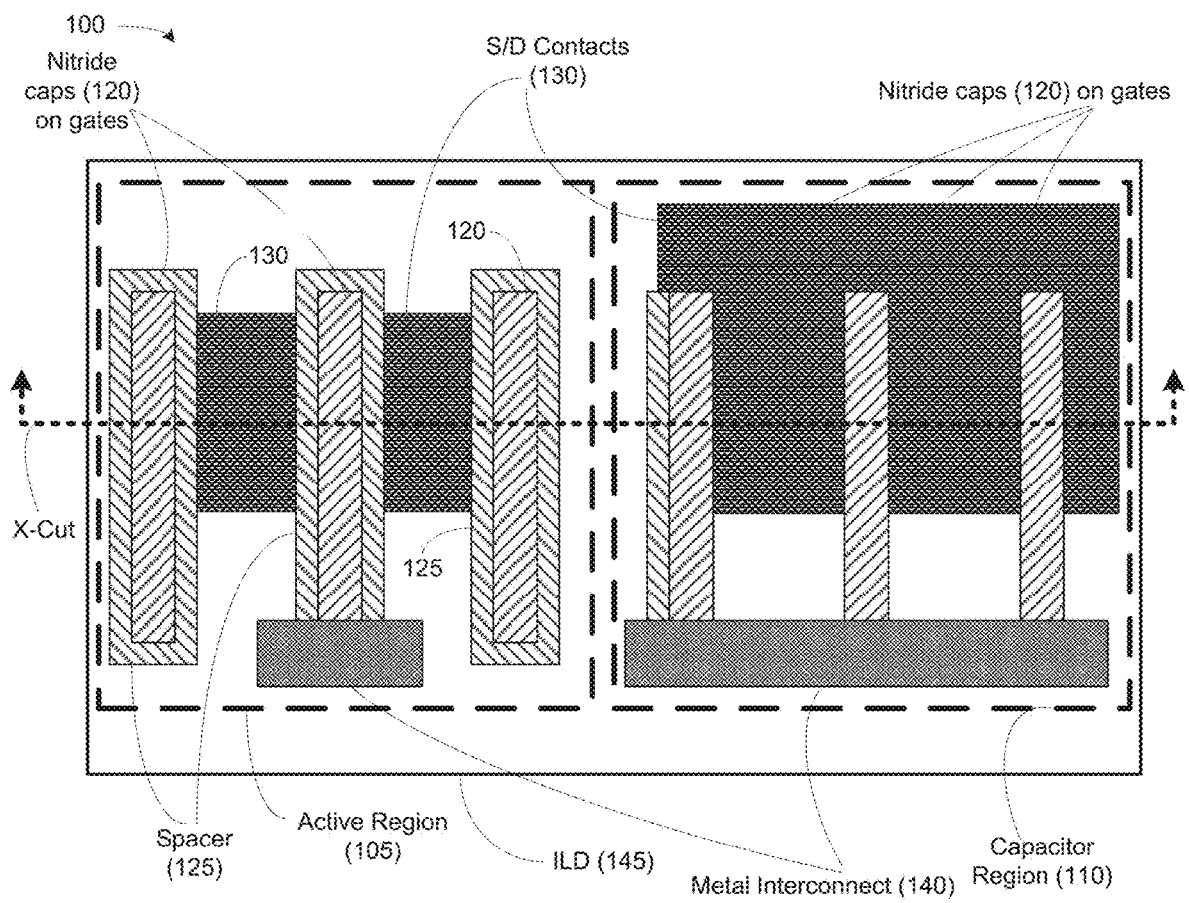
FIG. 1 illustrates a stylized, simplified plan view of a semiconductor device containing an active region and a capacitor region, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for semiconductor devices comprising both FinFETs and metal-insulator-metal (MIM) capacitors. The MIM capacitors of embodiments herein are formed in part from otherwise non-functional gates in non-FinFET containing regions of the semiconductor devices. Embodiments herein provide for forming MIM capacitors using at least a portion of the process(es) used for forming dummy gate features. Further, the formation of the MIM capacitors may utilize dummy gate features that are formed on active regions as well as on inactive regions for manufacturing efficiency. Embodiments herein provide for utilizing the space on semiconductor devices (i.e., inactive regions) that otherwise may have been wasted for forming the MIM capacitors, as provided by embodiments herein.

Turning now to FIG. 1, a stylized, simplified top view of semiconductor device, in accordance with embodiments herein, is illustrated. FIG. 1 illustrates a semiconductor device 100 that includes an active region 105 and a capacitor region 110. In the active region 105, the semiconductor device 100 contains a plurality of gates (not visible in top view), which may each be covered with a nitride cap 120. Each gate is surrounded on the sides by a spacer 125. The gates are disposed over a plurality of fins (not visible in top view). The long axis of the gates (oriented vertically in FIG. 1) is perpendicular to the long axis of the fins (oriented horizontally in FIG. 1). The fins each contain at least one source and at least one drain (S/D) on a top of the fin, with each S/D being disposed between two gates. The S/Ds are also not visible in the top view of FIG. 1). In the active region 105, source/drain (S/D) contacts 130 are disposed over the S/Ds and between two gates. The S/D contacts 130 contain a fill metal. Herein, the terms "S/D contact" and "fill metal" may be used interchangeably to refer to one or more of the elements labeled as source/drain contacts 130 in FIG. 1. Fill metal may include one of a plurality of metals that may be filled into predetermined regions of a semiconductor device for forming S/D contacts.

An isolation feature (not visible in top view in FIG. 1) is formed on a substrate (also not visible in top view in FIG. 1) and surrounds the lower portion of each fin. An interlayer dielectric (ILD) 145 is disposed in the active region 105 around the gates. Finally, the active region 105 contains at least one metal interconnect 140 disposed over at least one gate. The gate, source, drain, and fin together form a FinFET.

Generally, known gate formation processes minimize device variation by forming gates in regions of a semiconductor device lacking fins, wherein the gates are disposed on an isolation feature on a substrate. The gates disposed on the isolation feature in a region lacking fins are not functional as FinFET gates.

In the capacitor region 110 of the semiconductor device 100 shown in FIG. 1, gates each topped with a nitride cap 120 are present. The gates in the capacitor region 110 generally lack spacers 125. An S/D contact 130 is disposed partially between gates, where the S/D contact 130 contacts a high-k dielectric layer (not visible in top view in FIG. 1) disposed on the sides of the gate electrode of at least one gate. The interface between S/D contact 130, the high-k dielectric layer, and the gate electrode will be shown in cross-section in later figures. The S/D contact 130, the high-k dielectric layer, and the gate electrode together form a metal-insulator-metal (MIM) capacitor, as will be discussed in more detail below.

The capacitor region 110 also contains at least one metal interconnect 140. The metal interconnect 140 may contact a plurality of gates in the capacitor region 110.

FIG. 1 also shows an X-cut line provided for reference with respect to a cross-sectional view shown in subsequent figures. The X-cut line runs along the long axis of a fin. FIGS. 2-11 represent stylized cross-sectional views of fin-FET devices with respect to the X-cut line, in accordance with exemplary embodiments herein.

Figure 2:
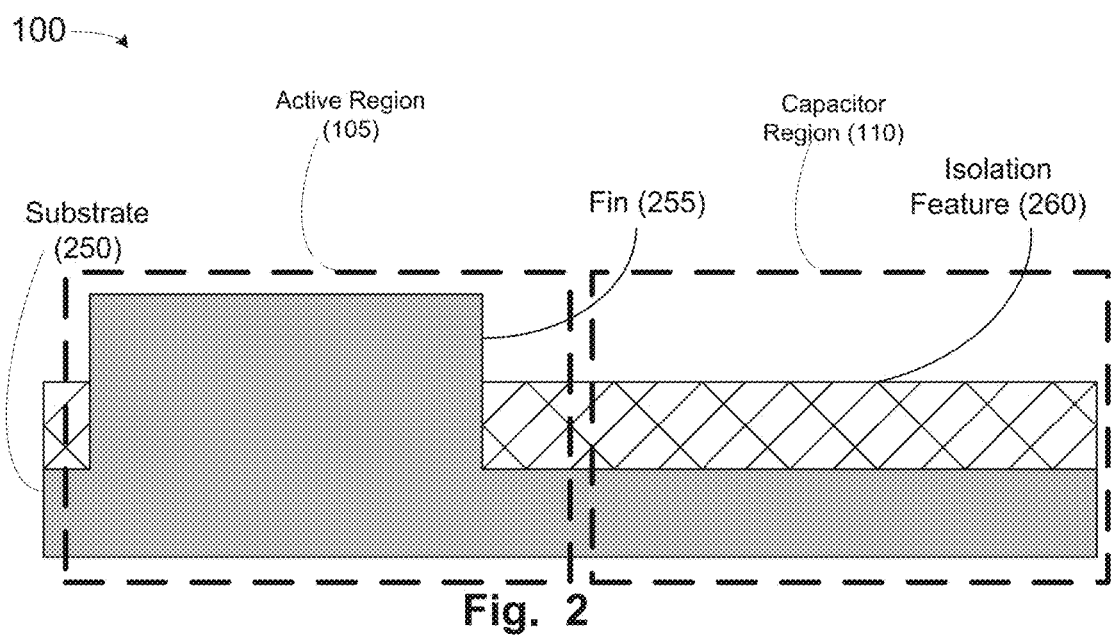
FIG. 2 illustrates a stylized X-cut cross-sectional depiction of a semiconductor device with respect to fin formation and isolation feature formation processes, in accordance with embodiments herein.

FIG. 2 illustrates a stylized X-cut cross-sectional depiction of a semiconductor device with respect to fin formation and isolation feature formation processes, in accordance with embodiments herein. The device 100 comprises a substrate 250 on which is disposed at least one fin 255 in the active region 105. The substrate 250 may contain any appropriate semiconductor substrate, such as silicon, silicon-germanium, or others known to the person of ordinary skill in the art. The fin 255 may be formed from the same material(s) as the substrate 250, or may be formed from one or more different materials. The fin 255 may comprise a plurality of horizontal layers, such as alternating layers of silicon and silicon-germanium. A structure comprising a plurality of horizontal layers may be referred to in the art as a "nanowire" or a "nanosheet." The term "fin 255" herein encompasses nanowire or nanosheet structures as well as traditional fin structures.

Surrounding the fin 255 in the active region 105, and disposed on the substrate 250 in the capacitor region 110, is an isolation feature 260. The isolation feature 260 may be formed from silicon oxide or other materials that generally inhibit current flow between fins 255 and/or MIM capacitors that will be formed in the capacitor region 110 in later processes. The isolation feature 260 may be termed a "shallow trench isolation" or "STI," even if no trench formation process is performed to form the isolation feature 260.

Figure 3:
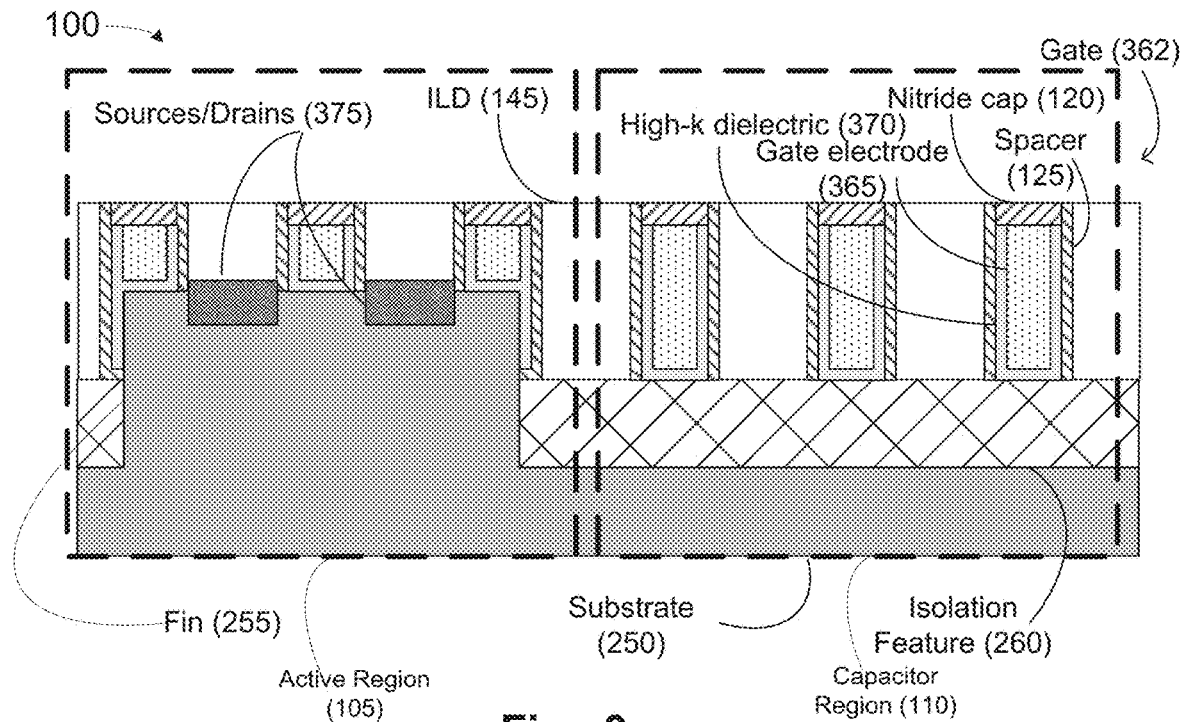
FIG. 3 illustrates a stylized X-cut cross-sectional depiction of a semiconductor device with respect to gate formation, source/drain (S/D) formation, and interlayer dielectric (ILD) formation processes, in accordance with embodiments herein.

FIG. 3 illustrates a stylized X-cut cross-sectional depiction of a semiconductor device with respect to gate formation, S/D formation, and interlayer dielectric (ILD) formation processes, in accordance with embodiments herein. A plurality of gates 362 are formed over the fins 255 and the isolation feature 260. Each gate 362 contains a gate electrode 365; a high-k dielectric layer 370 disposed on the sides and the bottom of the gate electrode 365; the nitride cap 120 disposed on the tops of the gate electrode 365 and the high-k dielectric 370; and the spacer 125 disposed on the sides of the high-k dielectric 370 and the nitride cap 120. In the active region 105, sources/drains 375 are disposed on and/or in the fin 255 adjacent to the spacer 125 on the sides of a gate 362. The gates 362 and the S/Ds 375 may be formed from known materials using known techniques.

As stated above, for reasons of manufacturing efficiency and consistency, gates 362 are formed in both the active region 105 and the capacitor region 110, even though the gates 362 in the capacitor region 110 will not function as gates in FinFET devices.

FIG. 3 also depicts an ILD 145 disposed between gates 362 and over S/Ds 375 and isolation feature 260. The ILD 145 may be formed from known materials using known techniques.

For the sake of clarity, the outlines of the active region 105 and the capacitor region 110 will be omitted from subsequent drawings, however those skilled in the art would appreciate its existence, as labeled in the drawings.

Figure 4:
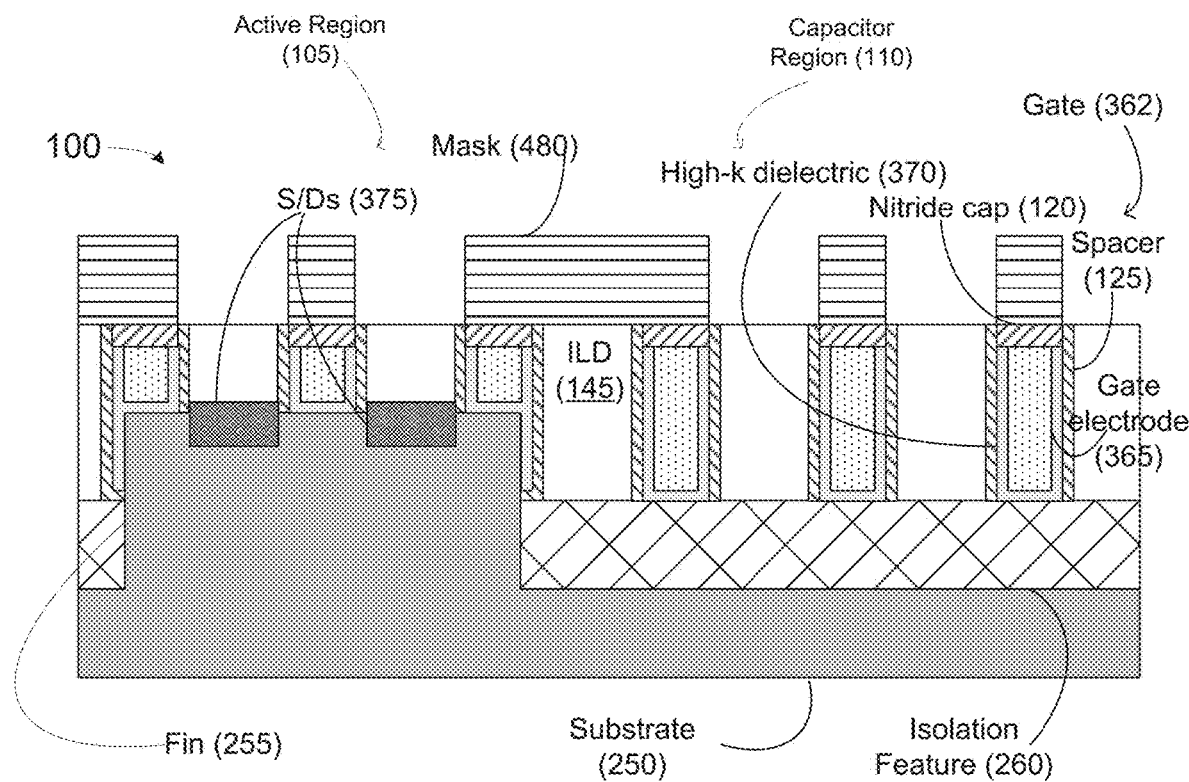
FIG. 4 illustrates a stylized X-cut cross-sectional depiction of a semiconductor device with respect to mask patterning processes, in accordance with embodiments herein.

FIG. 4 illustrates a stylized X-cut cross-sectional depiction of a semiconductor device with respect to mask patterning processes, in accordance with embodiments herein.

A mask 480 is formed over the semiconductor device 100 shown in FIG. 3 and the mask 480 is patterned to expose the ILD 145 disposed over S/Ds 375 and between gates 362 in the capacitor region 110. Portions of the ILD 145 that may be disposed between a gate 362 disposed wholly or partially on a fin 255 and another gate 362 disposed wholly on the isolation feature 260 may be retained.

Figure 5:
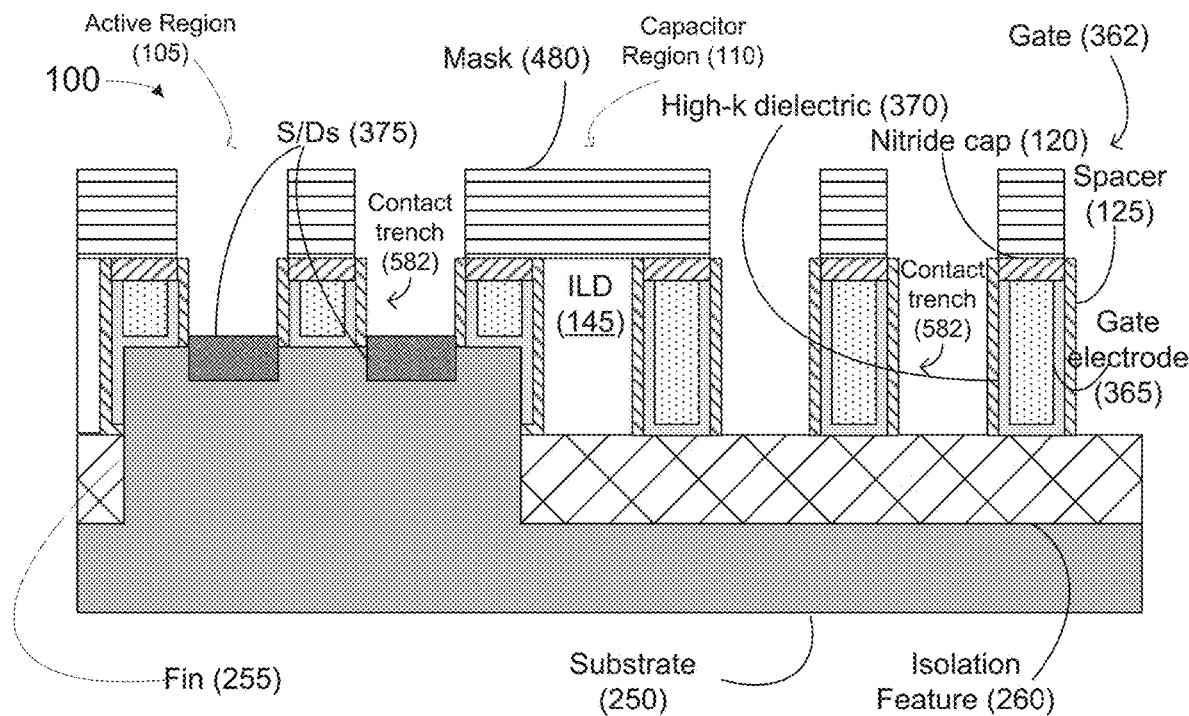
FIG. 5 illustrates a stylized X-cut cross-sectional depiction of a semiconductor device with respect to contact trench formation processes, in accordance with embodiments herein.

FIG. 5 illustrates a stylized X-cut cross-sectional depiction of a semiconductor device with respect to contact trench formation processes, in accordance with embodiments herein. The ILD 145 exposed by the mask 480 is removed, yielding contact trenches 582. As a result, the S/Ds 375, portions of the isolation feature 260 between gates 362 in the capacitor region 110, and spacers 125 on the sides of most gates 362 are exposed.

Figure 6:
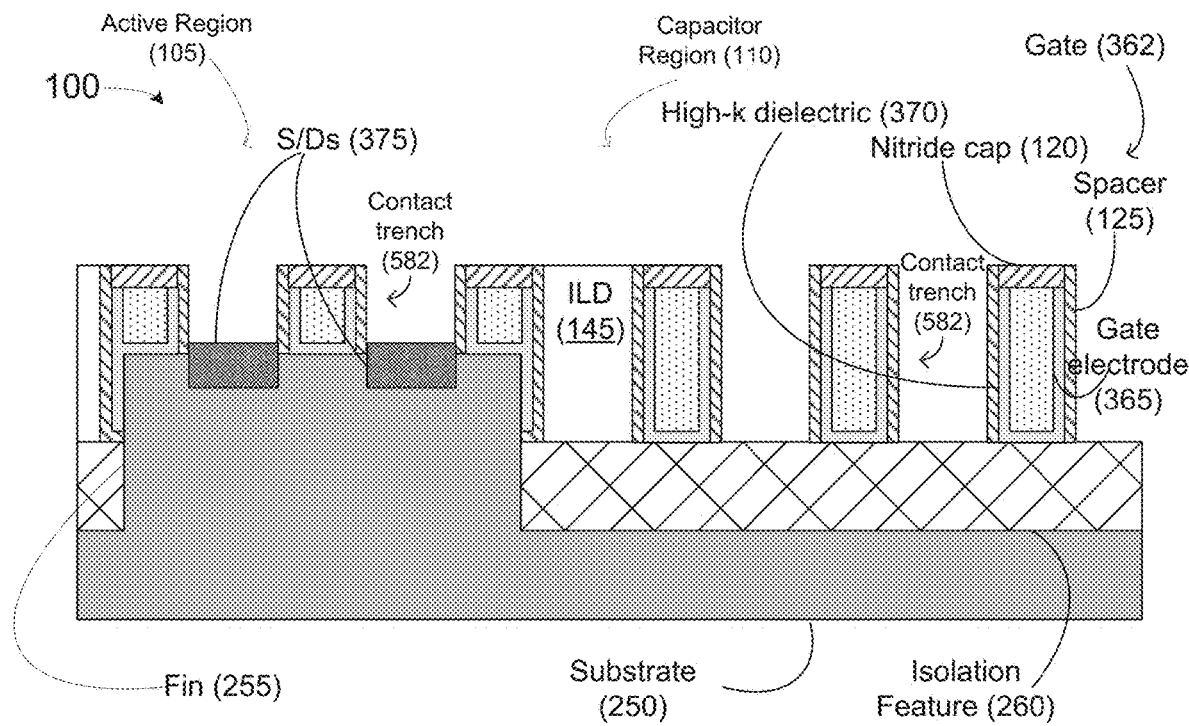
FIG. 6 illustrates a stylized X-cut cross-sectional depiction of a semiconductor device with respect to mask removal processes, in accordance with embodiments herein.

FIG. 6 illustrates a stylized X-cut cross-sectional depiction of a semiconductor device with respect to mask removal processes, in accordance with embodiments herein. The mask 480 may be removed by any known technique. This exposes the gate electrodes 365 covered by the nitride cap 120.

Figure 7:
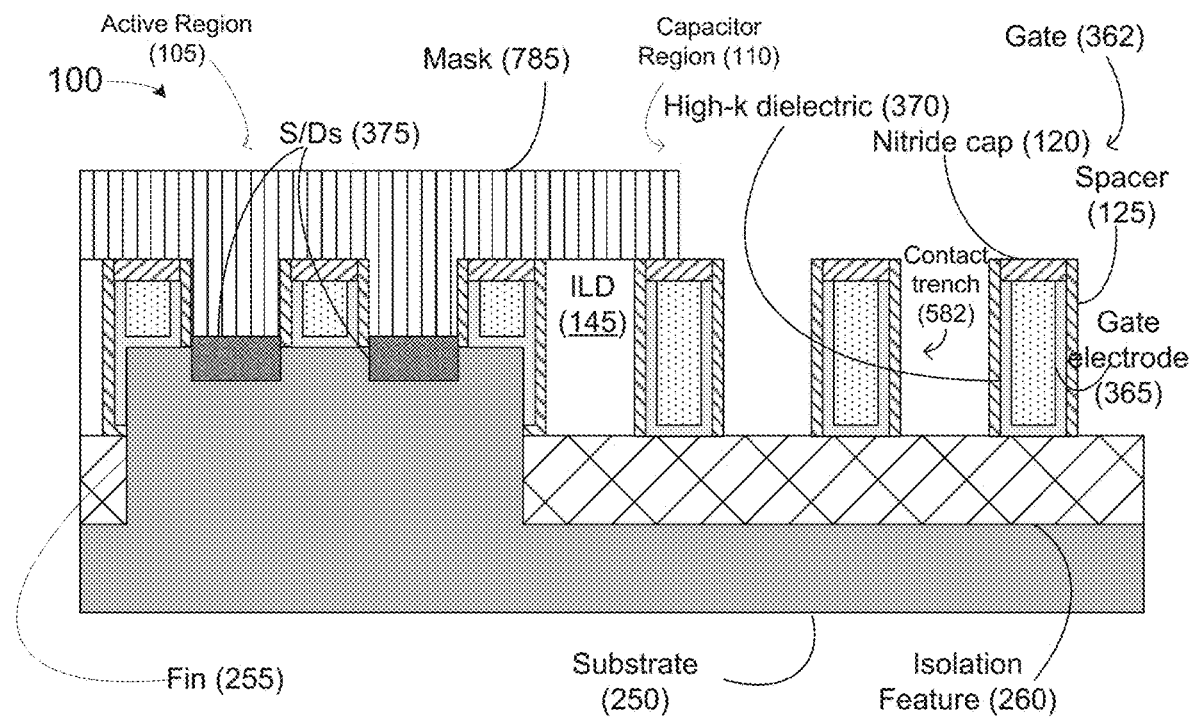
FIG. 7 illustrates a stylized X-cut cross-sectional depiction of a semiconductor device with respect to second mask formation processes, in accordance with embodiments herein.

FIG. 7 illustrates a stylized X-cut cross-sectional depiction of a semiconductor device with respect to second mask formation processes, in accordance with embodiments herein. A mask 785 is formed over the active region 105, thereby masking the S/Ds 375 and spacers 125 on the sides of gates 362 in the active region 105. The mask 785 is not formed over the capacitor region 110. Accordingly, the exposed portions of the isolation feature 260 and the exposed spacers 125 in the capacitor region 110 remain exposed.

Figure 8:
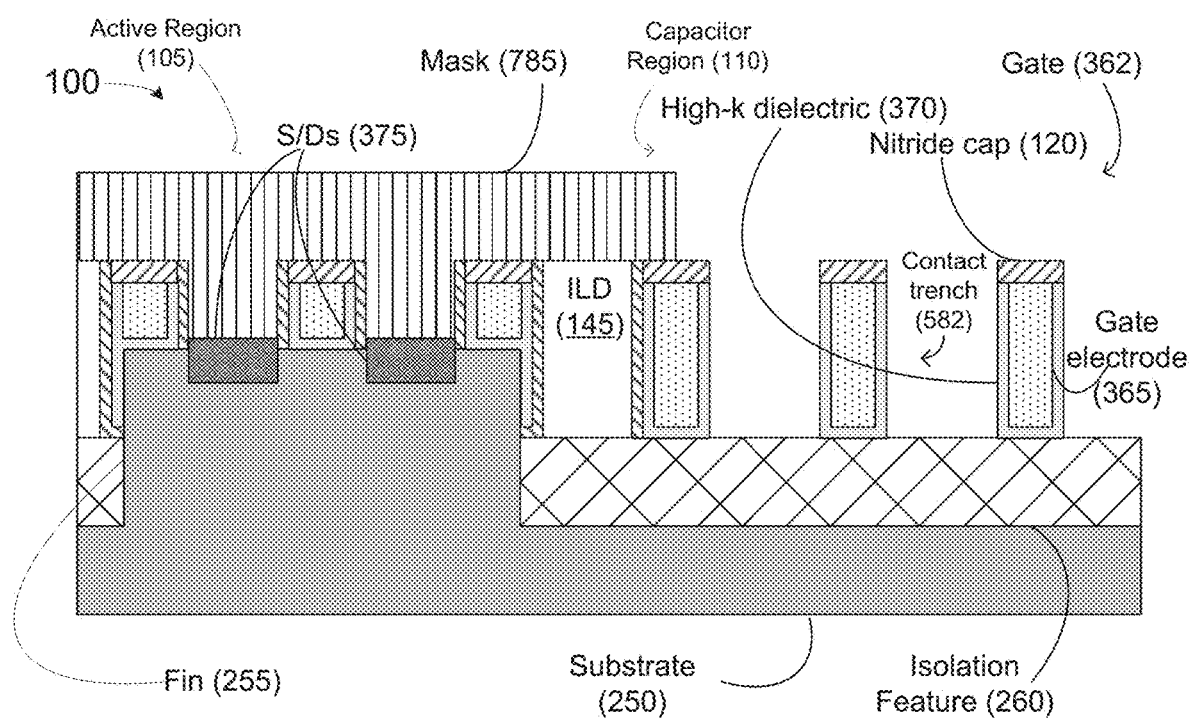
FIG. 8 illustrates a stylized X-cut cross-sectional depiction of a semiconductor device with respect to spacer removal processes, in accordance with embodiments herein.

FIG. 8 illustrates a stylized X-cut cross-sectional depiction of a semiconductor device with respect to spacer removal processes, in accordance with embodiments herein. The spacer 125 is removed where it is not masked by mask 785. Accordingly, at least one gate 362 in the capacitor region 110 now lacks the spacer 125, and contains only the gate electrode 365, the high-k dielectric 370, and the nitride cap 120.

Figure 9:
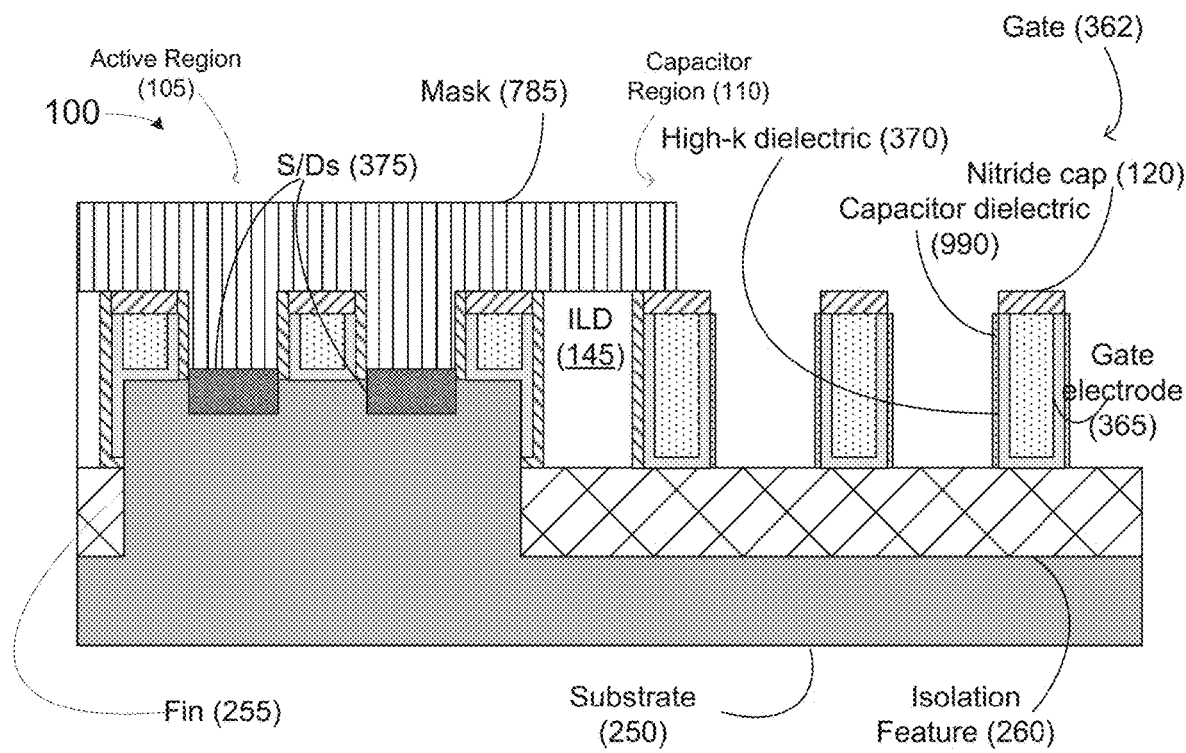
FIG. 9 illustrates a stylized X-cut cross-sectional depiction of a semiconductor device with respect to capacitor dielectric formation processes, in accordance with embodiments herein.

FIG. 9 depicts a stylized X-cut cross-sectional depiction of a semiconductor device with respect to capacitor dielectric formation processes, in accordance with embodiments herein. In the depicted embodiment, a capacitor dielectric 990 may be formed over the high-k dielectric 370 exposed on the sides of gates 362 in the capacitor region 110. In one embodiment, the capacitor dielectric 990 may contain hafnium oxide, zirconium oxide, aluminum oxide, or silicon oxide. Alternatively or in addition, the capacitor dielectric 990 may have a thickness from about 2 nm to about 5 nm.

Forming the capacitor dielectric 990 may involve depositing the dielectric material to a thickness greater than that desired in the final semiconductor device 100 and etching back excess dielectric material. The etching bask process may etch back part of the sidewall of the mask 785 adjacent to the capacitor region 110.

The capacitor dielectric 990 depicted in FIG. 9 is optional. Subsequent figures will show the semiconductor device 100 without depicting the capacitor dielectric 990. The person of ordinary skill in the art will understand that the capacitor dielectric 990 may be incorporated into the semiconductor device 100 depicted in the subsequent figures as a routine matter and remain within the spirit and scope of various embodiments herein.

Figure 10:
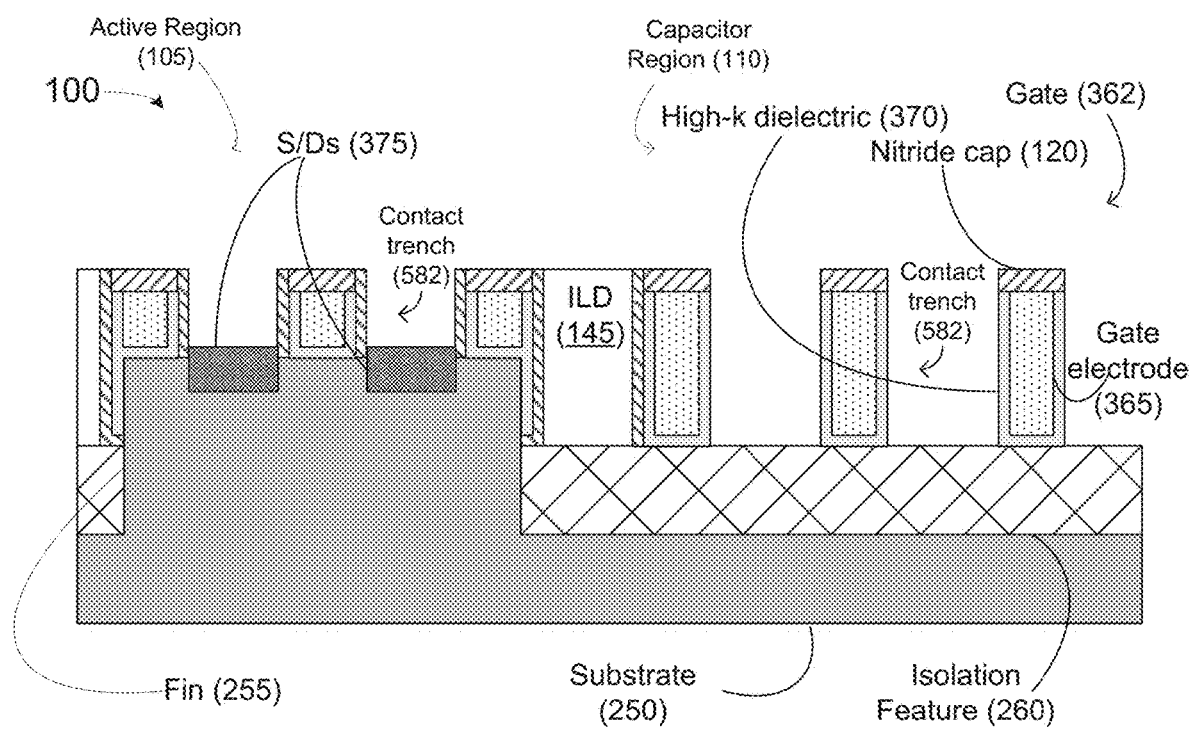
FIG. 10 illustrates a stylized X-cut cross-sectional depiction of a semiconductor device with respect to second mask removal processes, in accordance with embodiments herein.

FIG. 10 illustrates a stylized X-cut cross-sectional depiction of a semiconductor device with respect to second mask removal processes, in accordance with embodiments herein. The mask 785, which was in the active region 105, may be removed from semiconductor device 100 by any known technique. At this point, all of the gate electrodes 385 with nitride caps 120 are exposed. In the embodiment depicted in FIG. 10, the capacitor region 110, the gate electrodes 385 may be only surrounded by the high-k dielectric 370. In alternative embodiment, the capacitor dielectric 990 of FIG. 9 (not shown in FIG. 10) may also be present adjacent the high-k dielectric 370.

Figure 11:
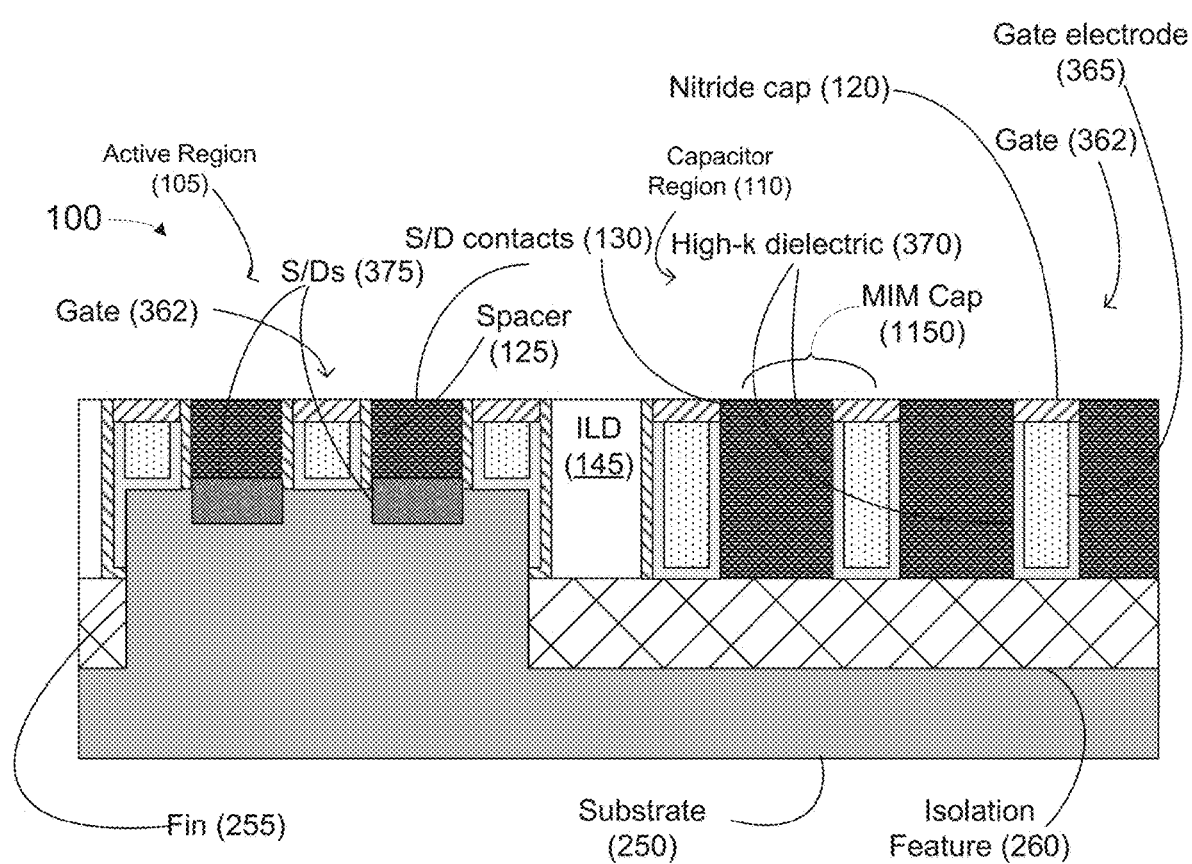
FIG. 11 illustrates a stylized X-cut cross-sectional depiction of a semiconductor device with respect to contact formation processes, in accordance with embodiments herein.

FIG. 11 illustrates a stylized X-cut cross-sectional depiction of a semiconductor device with respect to contact formation processes, in accordance with embodiments herein. S/D contacts 130 are formed in contact trenches 582. The S/D contacts 130 may be formed of known materials using known techniques.

After performing the processes depicted in FIG. 11, in the active region 105 are provided with FinFET devices containing a gate 362 and sources/drains 375. The channel of the FinFET device is provided by fin 255. S/D contacts 130 to S/Ds 375 permit the flow of current to or from S/Ds 375.

In the capacitor region 110, the deposition of the S/D contact material 130 in the capacitor region 110 provides for the formation of MIM capacitors 1150. The MIM capacitors 1150 contains a first plate, e.g. gate electrode 365 in the capacitor region 110; a second plate, e.g. S/D contact 130 in the capacitor region 110; and a dielectric between the plates, e.g. high-k dielectric 370 (or high-k dielectric 370 and capacitor dielectric 990, if the embodiment depicted in FIG. 9 is followed) in the capacitor region 110. In this manner, a plurality of MIM capacitors 1150 may be formed in an inactive region that generally may have been wasted (with regard to usage as an active region). Further, one or more of the processes that are performed already for forming gates may be used to form MIM capacitors 1150, as described herein. In this manner, a plurality of MIM capacitors 1150 may be formed in an otherwise unused area, using existing processes that otherwise would be wasted with regard to an inactive region. Thus, embodiments herein provide for forming MIM capacitors in a more efficient manner (i.e., while forming gate features) within device regions (i.e., inactive regions) that may now be efficiently used for capacitors.

Figure 12:
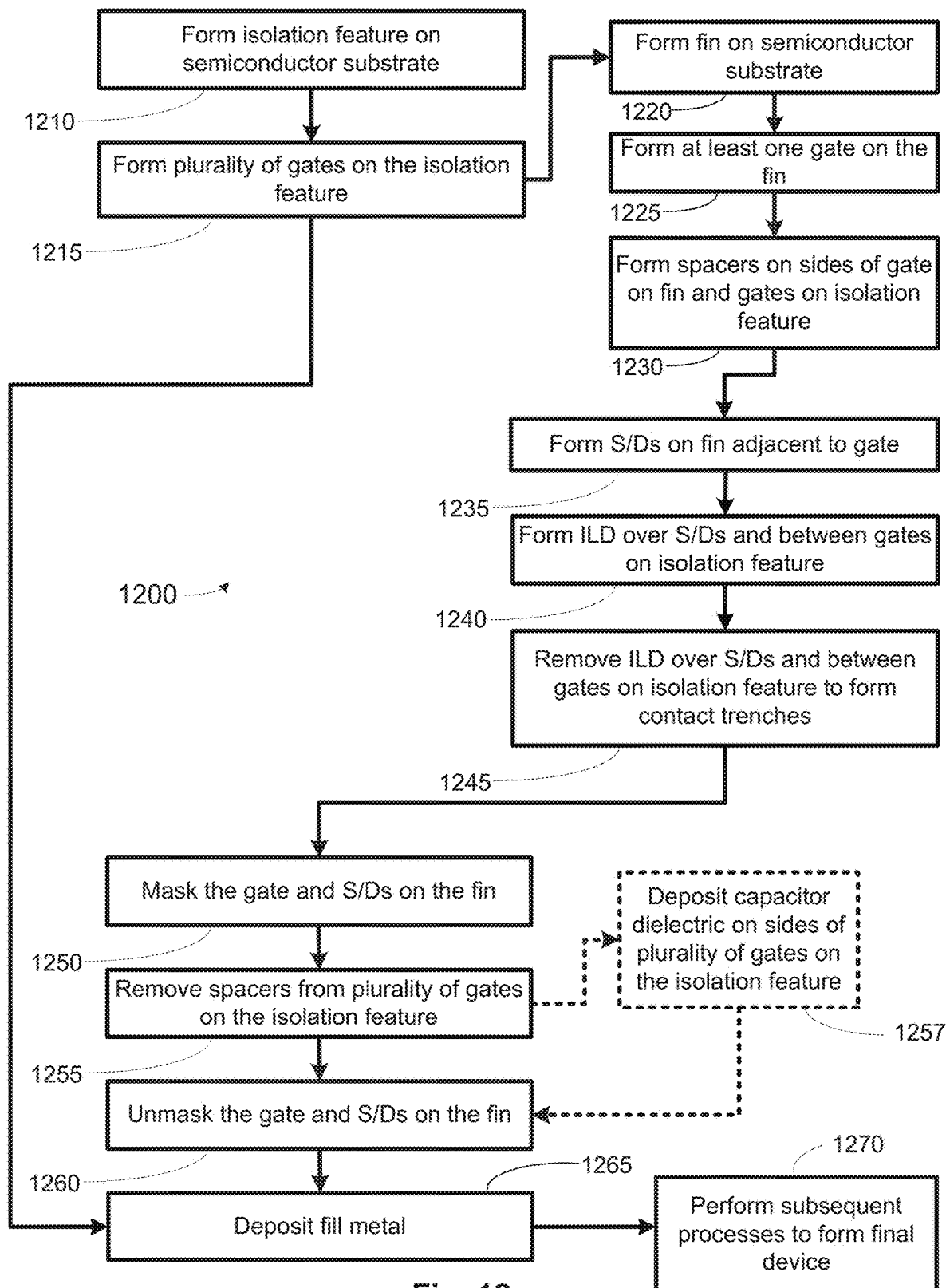
FIG. 12 illustrates a flowchart depiction of a method for manufacturing a semiconductor device, in accordance with embodiments herein.

Subsequent processes (not shown) may form the metal interconnect 140 over the active region 105 and the capacitor region 110. The metal interconnect 140 over the active region 105 allows control of the gate 362 of the FinFET device. The metal interconnect 140 over the capacitor region 110 allows parallel connections of the MIM capacitors. In other embodiments, metal features may be formed above the capacitor region 110 to interconnect a plurality of MIM capacitors Turning now to FIG. 12, a flowchart depiction of a method 1200 for manufacturing a semiconductor device in accordance with embodiments herein is illustrated. The method 1200 includes forming (at 1210) an isolation feature on a semiconductor substrate. The method 1200 also involves forming (at 1215) a plurality of gates on the isolation feature, wherein each gate comprises a gate electrode and a high-k dielectric layer disposed between the gate electrode and the isolation feature and disposed on and in contact with at least one side of the gate electrode.

In one embodiment, the method 1200 may then involve depositing (at 1265) a fill metal between the plurality of gates on the isolation feature. Each space between two gates on the isolation feature may be considered a contact trench. In a further embodiment, the fill metal may be in contact with the high-k dielectric layer on the at least one side of the gate electrode.

In another embodiment, the method 1200 may include, after forming (at 1215), forming (at 1220) a fin on the semiconductor substrate. The method 1200 may additionally involve forming (at 1225) at least one gate on the fin, wherein the at least one gate comprises a gate electrode, a high-k dielectric layer disposed between the gate electrode and the fin and disposed on and in contact with at least one side of the gate electrode. The method 1200 may additional include forming (at 1230) a spacer disposed on and in contact with the high-k dielectric layer on at least one side of the gate electrode of the at least one gate on the fin and disposed on and in contact with the high-k dielectric layer on at least one side of each gate electrode of the plurality of gates on the isolation feature. Additionally, the method 1200 may also include forming (at 1235) at least two sources/drains (S/Ds), each S/D disposed on and/or in the fin adjacent to the spacer on each side of the at least one gate. The method 1200 may further involve forming (at 1240) an interlayer dielectric (ILD) over each S/D and between the plurality of gates on the isolation feature, wherein the ILD is disposed in contact with the spacer. Yet further, the method 1200 may involve removing (at 1245) the ILD over each S/D and between the plurality of gates on the isolation feature, to yield a plurality of contact trenches each exposing either one of the S/Ds or the isolation feature.

In one embodiment, the method 1200 may include depositing (at 1257) a capacitor dielectric over the high-k dielectric layer on each side of each gate of the plurality of gates on the isolation feature. In a particular embodiment, the capacitor dielectric may contain hafnium oxide, zirconium oxide, aluminum oxide, or silicon oxide. Alternatively or in addition, the capacitor dielectric may have a thickness from about 2 nm to about 5 nm.

Returning to the main flow, the method 1200 may yet additionally include masking (at 1250) the at least one gate and the at least two S/Ds on the fin; removing (at 1255) the plurality of spacers disposed on and in contact with the high-k dielectric layer on at least one side of each gate electrode of the plurality of gates on the isolation feature; and unmasking (at 1260) the at least one gate and the at least two S/Ds on the fin. Flow then passes to depositing (at 1265) the fill metal in each contact trench.

In one embodiment of the method 1200, wherein the plurality of gates on the isolation feature and the at least one gate on the fin are formed in the same process, i.e., the forming (at 1215) and the forming (at 1225) are achieved in the same process. Alternatively or in addition, removing (at 1245) the ILD over each S/D and the ILD between the plurality of gates on the isolation feature is achieved in one process. Alternatively or in addition, depositing (at 1265) the fill metal between the plurality of gates on the isolation feature and in each contact trench exposing an S/D is achieve in one process.

The method 1200 may include performing (at 1270) subsequent processes to form a final semiconductor device for use or sale. The subsequent processes performed (at 1270) may include, but are not limited to, forming metal interconnects over at least one gate over the fin and over at least one gate over the isolation feature.

The method 1200 may yield a semiconductor device 100, comprising a semiconductor substrate 250; an isolation feature 260 on the substrate; a plurality of gates 362 on the isolation feature 260, wherein each gate 362 comprises a gate electrode 365 and a high-k dielectric layer 370 disposed between the gate electrode 365 and the isolation feature 260 and disposed on and in contact with at least one side of the gate electrode 365; and a fill metal 130 between the plurality of gates 362 on the isolation feature 260.

In one embodiment, in the semiconductor device 100 yielded by the method 1200, the fill metal 130 is in contact with the high-k dielectric layer 370 on the at least one side of the gate electrode 365. In another embodiment, the fill metal 130 is in contact with a capacitor dielectric 990 disposed on the high-k dielectric layer 370 on the at least one side of the gate electrode 365.

In one embodiment, the semiconductor device 100 yielded by the method 1200 may further contain a fin 255 on the semiconductor substrate 250; at least one gate 362 on the fin, wherein the at least one gate 362 comprises a gate electrode 365, a high-k dielectric layer 370 disposed between the gate electrode 365 and the fin 255 and disposed on and in contact with at least one side of the gate electrode 365, and a spacer 125 disposed on and in contact with the high-k dielectric layer 370 on at least one side of the gate electrode 365; at least two sources/drains (S/Ds) 375, each S/D 375 disposed on and/or in the fin 255 adjacent to the spacer 125 on each side of the at least one gate 362; and the fill metal 130 disposed adjacent to both sides of the at least one gate 362 on the fin 255 and in contact with each S/D 375.

Figure 13:
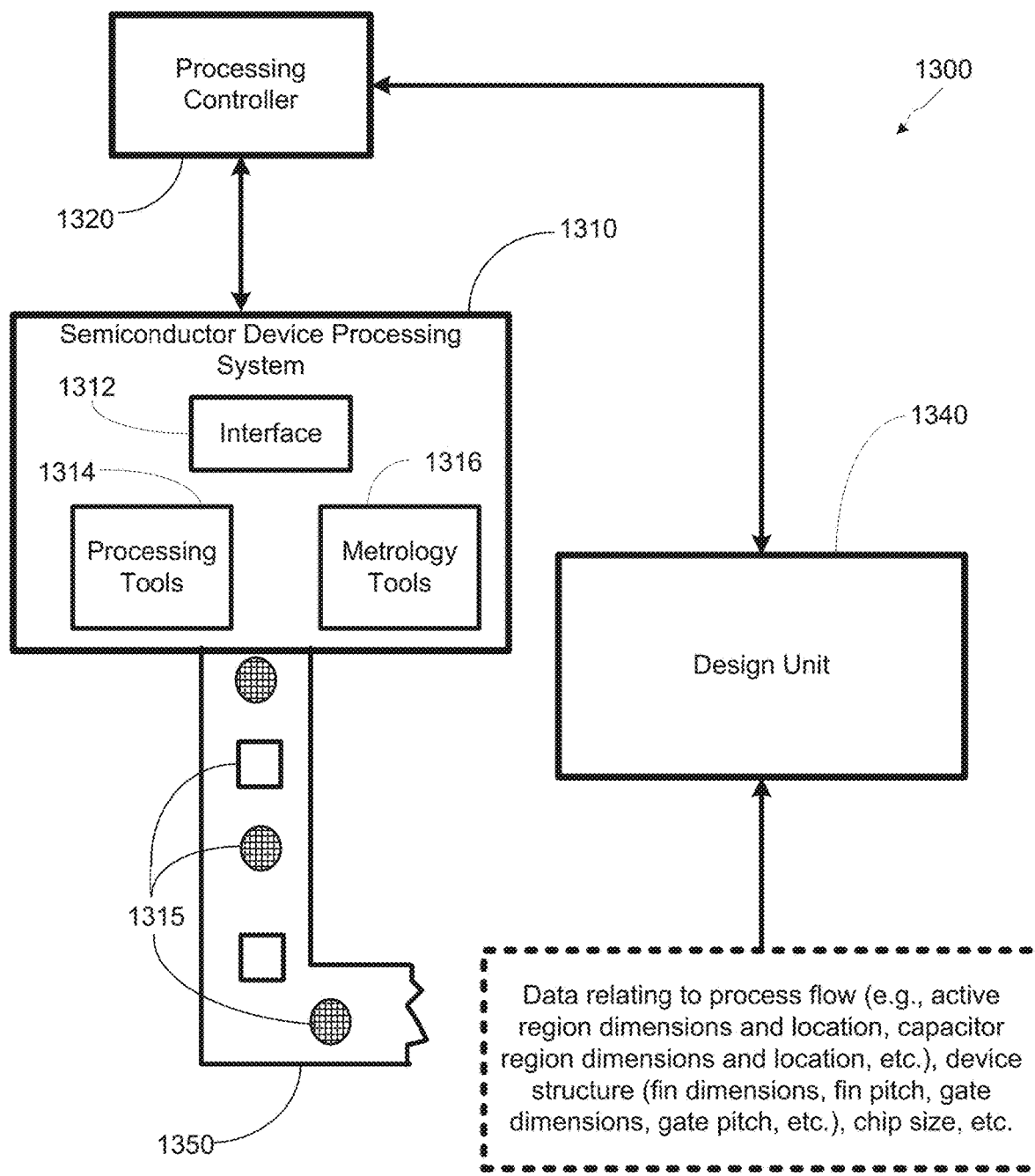
FIG. 13 illustrates a stylized depiction of a system for fabricating a semiconductor device comprising a semiconductor device, in accordance with embodiments herein.

Turning now to FIG. 13, a stylized depiction of a system for fabricating a semiconductor device comprising an integrated circuit, in accordance with embodiments herein, is illustrated. The system 1300 provides for forming a semiconductor device 100 by the method 1200.

The system 1300 of FIG. 13 may comprise a semiconductor device processing system 1310 and a design unit 1340. The semiconductor device processing system 1310 may manufacture integrated circuit devices based upon one or more designs provided by the design unit 1340.

The semiconductor device processing system 1310 may comprise various processing stations, such as etch process stations, photolithography process stations, oxide deposition process stations, CMP process stations, Epitaxy (EPI) process stations, etc. One or more of the processing steps performed by the processing system 1310 may be controlled by the processing controller 1320. The processing controller 1320 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1310 may produce integrated circuits on a medium, such as silicon wafers. More particularly, the semiconductor device processing system 1310 produce semiconductor devices containing MIM capacitors, as described above.

The production of integrated circuits by the device processing system 1310 may be based upon the circuit designs provided by the integrated circuits design unit 1340. The processing system 1310 may provide processed integrated circuits/devices 1315 on a transport mechanism 1350, such as a conveyor system. In some embodiments, the conveyor system may be sophisticated clean room transport systems that are capable of transporting semiconductor wafers. In one embodiment, the semiconductor device processing system 1310 may comprise a plurality of processing steps to perform sigma recess regions, filling them with an REO material, and forming EPI features on the REO material, as described above.

In some embodiments, the items labeled "1315" may represent individual wafers, and in other embodiments, the items 1315 may represent a group of semiconductor wafers, e.g., a "lot" of semiconductor wafers. The integrated circuit or device 1315 may be a transistor, a capacitor, a resistor, a memory cell, a processor, and/or the like.

The design unit 1340 of the system 1300 is capable of providing a circuit design that may be manufactured by the semiconductor processing system 1310. The design unit 1340 may be capable of determining the chip size, the number of devices (e.g., processors, memory devices, etc.) to place in a device package, the dimensions and locations of active regions, the dimensions and locations of capacitor regions, and device structure (fin dimensions, fin pitch, gate dimensions, gate pitch, etc.), among others. Based upon such details of the devices, the design unit 1340 may determine specifications of the semiconductor devices that are to be manufactured. Based upon these specifications, the design unit 1340 may provide data for manufacturing a semiconductor device having the FinFETs and MIM capacitors provided by embodiments herein.

The system 1300 may be capable of performing analysis and manufacturing of various products involving various technologies. For example, the system 1300 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a fin in an active region on the semiconductor substrate;
    forming an isolation feature on a semiconductor substrate;
    forming a plurality of gates on the isolation feature, wherein each gate comprises a gate electrode and a high-k dielectric layer disposed between the gate electrode and the isolation feature and touching at least one side of the gate electrode, wherein at least one gate of the plurality of gates is on the fin and comprises a gate electrode, and a high-k dielectric layer disposed between the gate electrode and the fin and disposed on and in contact with at least one side of the gate electrode,
    forming a spacer touching the high-k dielectric layer on at least one side of the gate electrode of the at least one gate on the fin and touching the high-k dielectric layer on at least one side of each gate electrode of the plurality of gates on the isolation feature; and
    depositing a fill metal between the plurality of gates on the isolation feature, wherein the fill metal after deposition touches the high-k dielectric layer on at least one side of and below a top of the gate electrode of at least one of the plurality of gates.

2. The method of claim 1; wherein forming the isolation feature comprises forming the isolation feature in an inactive region.

3. The method of claim 1, further comprising:
forming at least two sources/drains (S/Ds), each S/D disposed on and/or in the fin adjacent to the spacer on each side of the at least one gate;
forming an interlayer dielectric (ILD) over each S/D and between the plurality of gates on the isolation feature, wherein the ILD is disposed in contact with the spacer;
removing the ILD over each S/D and between the plurality of gates on the isolation feature, to yield a plurality of contact trenches each exposing either one of the S/Ds or the isolation feature;
masking the at least one gate and the at least two S/Ds on the fin;
removing the plurality of spacers disposed on and in contact with the high-k dielectric layer on at least one side of each gate electrode of the plurality of gates on the isolation feature;
unmasking the at least one gate and the at least two S/Ds on the fin; and
depositing the fill metal in each contact trench.

4. The method of claim 3, wherein the plurality of gates on the isolation feature and the at least one gate on the fin are formed in the same process; the ILD over each S/D and the ILD between the plurality of gates on the isolation feature are removed in the same process; and the fill metal between the plurality of gates on the isolation feature and in each contact trench are deposited in the same process.

5. A system, comprising:
a semiconductor device processing system to manufacture a semiconductor device; and
a processing controller operatively coupled to the semiconductor device processing system, the processing controller configured to control an operation of the semiconductor device processing system;
wherein the semiconductor device processing system is adapted to:
form a fin in an active region on the semiconductor substrate;
form an isolation feature on a semiconductor substrate;
form a plurality of gates on the isolation feature, wherein each gate comprises a gate electrode and a high-k dielectric layer disposed between the gate electrode and the isolation feature and touching at least one side of the gate electrode, wherein at least one gate of the plurality of gates is on the fin and comprises a gate electrode, and a high-k dielectric layer disposed between the gate electrode and the fin and disposed on and in contact with at least one side of the gate electrode;
form a spacer touching the high-k dielectric layer on at least one side of the gate electrode of the at least one gate on the fin and touching the high-k dielectric layer on at least one side of each gate electrode of the plurality of gates on the isolation feature; and
deposit a fill metal between the plurality of gates on the isolation feature, wherein the fill metal after deposition touches the high-k dielectric layer on at least one side of and below a top of the gate electrode of at least one of the plurality of gates.

6. The system of claim 5, wherein the semiconductor device processing system is adapted to form the fill metal to contact the high-k dielectric layer on the at least one side of the gate electrode.

7. The system of claim 5, wherein the semiconductor device processing system is further adapted to:
form at least two sources/drains (S/Ds), each S/D disposed on and/or in the fin adjacent to the spacer on each side of the at least one gate;
form an interlayer dielectric (ILD) over each S/D and between the plurality of gates on the isolation feature, wherein the ILD is disposed in contact with the spacer;
remove the ILD over each S/D and between the plurality of gates on the isolation feature, to yield a plurality of contact trenches each exposing either one of the S/Ds or the isolation feature;
mask the at least one gate and the at least two S/Ds on the fin;
remove the plurality of spacers disposed on and in contact with the high-k dielectric layer on at least one side of each gate electrode of the plurality of gates on the isolation feature;
unmask the at least one gate and the at least two S/Ds on the fin; and
deposit the fill metal in each contact trench.

8. The system of claim 7, wherein the semiconductor device processing system is adapted to form the plurality of gates on the isolation feature and the at least one gate on the fin in the same process; remove the ILD over each S/D and the ILD between the plurality of gates on the isolation feature in the same process; and deposit the fill metal between the plurality of gates on the isolation feature and in each contact trench in the same process.

* * * * *